United States Patent
Park

(10) Patent No.: US 10,429,716 B2
(45) Date of Patent: Oct. 1, 2019

(54) LASER BEAM STEERING DEVICE AND SYSTEM INCLUDING THE SAME

(71) Applicant: SAMSUNG ELECTRONICS CO., LTD., Suwon-si (KR)

(72) Inventor: Jaechul Park, Yangju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/623,623

(22) Filed: Jun. 15, 2017

(65) Prior Publication Data

US 2018/0157146 A1 Jun. 7, 2018

(30) Foreign Application Priority Data

Dec. 1, 2016 (KR) ........................ 10-2016-0162914

(51) Int. Cl.
*G02B 6/28* (2006.01)
*G02F 1/29* (2006.01)
(Continued)

(52) U.S. Cl.
CPC ............ *G02F 1/292* (2013.01); *G01S 7/4814* (2013.01); *G01S 7/4817* (2013.01); *G01S 7/4911* (2013.01);
(Continued)

(58) Field of Classification Search
CPC ...... G01S 3/802; G01S 7/4814; G01S 7/4817; G01S 7/4911; G02F 1/0102; G02F 1/0105; G02F 1/011; G02F 1/0356; G02F 1/29; G02F 1/292; G02F 1/3515; G02F 1/365; G02F 2201/34; G02F 2203/02; G02F 2203/055; H01Q 1/00; G02B 6/00; G02B 6/12004; G02B 6/2848; G02B 6/3518; G02B 6/3524; G02B 26/08; G02B 26/10; H01S 3/00; H01S 3/005; H01S 3/0071; H01S 3/0078; H01S 5/005; H01S 5/0071;
(Continued)

(56) References Cited

U.S. PATENT DOCUMENTS 3,453,626 A * 7/1969 Knight .................... G01S 3/802
342/441
7,068,234 B2 6/2006 Sievenpiper
(Continued)

OTHER PUBLICATIONS

Yao-Wei Huang, et al., "Gate-tunable conducting oxide metasurfaces", California Institute of Technology, Sep. 2, 2016, Total 13 pages.

*Primary Examiner* — Loha Ben
(74) *Attorney, Agent, or Firm* — Sughrue Mion, PLLC

(57) ABSTRACT

A laser beam steering device for two-dimensionally steering a laser beam may include a refractive index converting layer whose charge concentration is configured to change based on an electric signal applied thereto; an antenna disposed above the refractive converting layer; a laser beam reflecting layer disposed below the refractive index converting layer and including a plurality of cells arranged in a two-dimensional matrix; and a driver disposed below the laser beam reflecting layer and including a plurality of driving circuits respectively connected to the plurality of cells, the plurality of driving circuits being configured to respectively apply electric signals to the plurality of cells.

20 Claims, 14 Drawing Sheets

(51) Int. Cl.
*H01S 3/00* (2006.01)
*H01S 5/00* (2006.01)
*G01S 7/481* (2006.01)
*G01S 7/491* (2006.01)
*G02B 26/08* (2006.01)
*G02B 26/10* (2006.01)

(52) U.S. Cl.
CPC .......... *H01S 3/0071* (2013.01); *H01S 5/0071* (2013.01); *G02B 6/2848* (2013.01); *G02B 26/08* (2013.01); *G02B 26/10* (2013.01); *G02F 2201/34* (2013.01)

(58) Field of Classification Search
CPC ..... H01S 5/0078; H04B 10/572; H04B 10/60; H04B 10/80; H04B 10/803; H04B 10/808; H04B 10/69
USPC ...... 359/201.2, 202.1, 212.1, 237, 245, 259, 359/290, 291, 298, 305, 310, 316, 315; 342/74, 81, 359, 441, 445; 343/720, 721, 343/753, 754; 367/107, 128, 129
See application file for complete search history.

(56) References Cited

U.S. PATENT DOCUMENTS

| | | | |
|---|---|---|---|
| 9,195,052 B2* | 11/2015 | Long | G02F 1/0126 |
| 9,244,268 B2* | 1/2016 | Long | G02F 1/0126 |
| 9,274,352 B2* | 3/2016 | Long | G02F 1/0126 |
| 9,335,548 B1 | 5/2016 | Cakmakci et al. | |
| 9,952,454 B2* | 4/2018 | Long | G02F 1/0126 |
| 2016/0223723 A1 | 8/2016 | Han et al. | |
| 2017/0153528 A1 | 6/2017 | Kim et al. | |
| 2018/0062341 A1* | 3/2018 | Kim | G02F 1/292 |
| 2018/0136542 A1* | 5/2018 | Kim | G02B 6/1226 |

* cited by examiner

▨ ANTENNA UNIT
⋯ REFRACTIVE INDEX CONVERTING LAYER
▨ LASER BEAM REFLECTING LAYER

LASER BEAM STEERING DEVICE AND SYSTEM INCLUDING THE SAME

CROSS-REFERENCE TO RELATED APPLICATION

This application claims priority from Korean Patent Application No. 10-2016-0162914, filed on Dec. 1, 2016, in the Korean Intellectual Property Office, the disclosure of which is incorporated herein in its entirety by reference.

BACKGROUND

1. Field

The present disclosure relates to a laser beam steering device and a system including the same.

2. Description of the Related Art

In order to steer a laser beam to a desired location, a method of mechanically rotating a laser-irradiating portion and an optical phased array (OPA) method have been commonly utilized. In the OPA method, a laser beam is steered by electrically or thermally controlling cells or waveguides. Also, a motor or a micro electro mechanical system (MEMS) is used in the method of mechanically rotating a laser-irradiating portion. Accordingly, the overall volume and cost of a system including a MEMS may increase.

SUMMARY

Provided are a laser beam steering device for two-dimensionally steering a laser beam by disposing a laser beam reflecting layer in the form of a plurality of cells and independently controlling data voltages through driving circuits disposed below the respective cells and a system including the laser beam steering device.

Additional aspects will be set forth in part in the description which follows and, in part, will be apparent from the description, or may be learned by practice of various exemplary embodiments.

According to an aspect of an exemplary embodiment, a laser beam steering device for two-dimensionally steering a laser beam may include a refractive index converting layer whose charge concentration is configured to change based on an electric signal applied thereto; an antenna disposed above the refractive index converting layer; a laser beam reflecting layer disposed below the refractive index converting layer and including a plurality of cells arranged in a two-dimensional matrix; and a driver disposed below the laser beam reflecting layer and including a plurality of driving circuits respectively connected to the plurality of cells and configured to respectively apply electric signals the plurality of cells.

According to an aspect of another exemplary embodiment, a system may include a controller; a laser beam source configured to emit a laser beam; a laser beam steering device configured to steer the laser beam incident thereon emitted from the laser beam source; and a light receiver configured to receive the laser beam. The laser beam steering device may include a refractive index converting layer whose charge concentration is configured to change based on an electric signal applied thereto; an antenna disposed above the refractive index converting layer; a laser beam reflecting layer disposed below the refractive index converting layer and including a plurality of cells arranged in a two-dimensional matrix; and a driver disposed below the laser beam reflecting layer and including a plurality of driving circuits respectively connected to the plurality of cells and configured to respectively apply electric signals to the plurality of cells.

According to an aspect of another exemplary embodiment, a method of two-dimensionally steering a laser beam may include selecting at least one row of driving circuits from among a plurality of driving circuits that are included in a laser beam steering device and arranged in a two-dimensional matrix; storing data voltages in capacitors included in the at least one row of driving circuits; retaining the data voltages stored in the capacitors in the at least one row of driving circuits until other data voltages are stored in remaining capacitors included in the plurality of driving circuits; and, after the other data voltages are stored in the remaining capacitors included in the plurality of driving circuits, emitting the laser beam from a laser beam source to the laser beam steering device.

BRIEF DESCRIPTION OF THE DRAWINGS

The above and/or other aspects will become apparent and more readily appreciated from the following description of various exemplary embodiments, taken in conjunction with the accompanying drawings in which.

DETAILED DESCRIPTION

Figure 1:
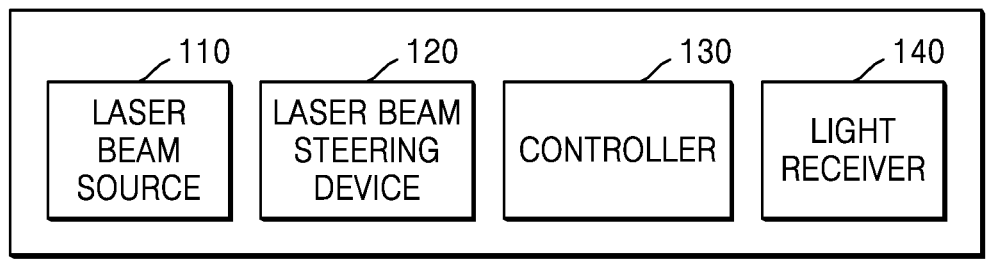
FIG. 1 is a schematic diagram showing a system including a laser beam steering device, according to an exemplary embodiment.

Reference will now be made in detail to various exemplary embodiments, which are illustrated in the accompanying drawings, wherein like reference numerals refer to like elements throughout. In this regard, the present embodiments may have different forms and should not be construed as being limited to the descriptions set forth herein. Accordingly, the exemplary embodiments are merely described below, by referring to the figures, to explain aspects. Expressions such as "at least one of," when preceding a list of elements, modify the entire list of elements and do not modify the individual elements of the list.

With respect to the terms in the various exemplary embodiments of the present disclosure, the general terms which are currently and widely used are selected in consideration of functions of structural elements in the various exemplary embodiments of the present disclosure. However, meanings of the terms may be changed according to intention, a judicial precedent, appearance of a new technology, and the like. In addition, in certain cases, a term which is not commonly used may be selected. In such a case, the meaning of the term will be described in detail at the corresponding part in the description of the present disclosure. Therefore, the terms used in the various exemplary embodiments of the present disclosure should be defined based on the meanings of the terms and the descriptions provided herein.

Throughout the specification, it will be understood that when a portion is referred to as being "connected to" another portion, it can be "directly connected to" the other portion or "electrically connected to" the other portion via another element. Furthermore, it will be further understood that the terms "comprises" and/or "comprising" used herein specify the presence of stated features or components, but do not preclude the presence or addition of one or more other features or components. In addition, the terms "-er", "-or", and "module" described in the specification mean units for processing at least one function and operation and can be implemented by hardware components or software components and combinations thereof.

As used in exemplary embodiments described below, terms such as "comprises" or "comprising" should not be construed as necessarily including all of the various elements or steps described in the specification. Rather, it should be interpreted that some of the elements or some of the steps may not be included or additional components or additional steps may be included.

Furthermore, in the exemplary embodiments, when it is described that a certain material layer is present on a substrate or another layer, the material layer may be present in direct contact with the substrate or the other layer or a third layer may be present therebetween. In addition, materials constituting respective layers in below embodiments are merely examples, and materials other than those materials may also be used.

Descriptions of the exemplary embodiments should not be construed as limiting the scope of the present disclosure. Anything that may be easily inferred by one of ordinary skill in the art should be understood as being within the scope of the present disclosure. Hereinafter, exemplary embodiments will be described in detail with reference to the accompanying drawings.

FIG. 1 is a schematic diagram showing a system including a laser beam steering device, according to an exemplary embodiment.

A system 100 may include a laser beam source 110, a laser beam steering device 120, a controller 130, and a light receiver 140. The system 100 may be a light detection and ranging (LiDAR) sensor capable of radiating a plurality of laser beams ahead at a predetermined angle and analyzing times of flight (TOF) of reflected laser beams, but is not limited thereto. The system 100 may obtain information regarding a distance to and location of an object ahead and generate a three-dimensional image of the object by using the analyzed TOF The laser beam source 110 may emit light and may include a light-emitting diode (LED) or a laser diode (LD), but is not limited thereto. The laser beam source 110 may emit a laser beam toward the laser beam steering device 120.

The laser beam steering device 120 may steer a laser beam incident from the laser beam source 110 by using an optical phase array (OPA) mechanism. In detail, an OPA method may include a method of steering an incident laser beam by applying an electrical signal to a refractive index converting layer to change a carrier density thereof.

The controller 130 may control the components included in the system 100. For example, the controller 130 may apply a voltage to the laser beam steering device 120, thereby determining a direction for emitting a laser beam. Furthermore, the controller 130 may collect reflected laser beams via the light receiver 140 and calculate a TOF of the laser beams. The control 130 may include one or more central processing units (CPUs).

The light receiver 140 may collect laser beams reflected by an external object. The light receiver 140 may include, but is not limited to, a photodiode or an optical sensor.

Figure 2:
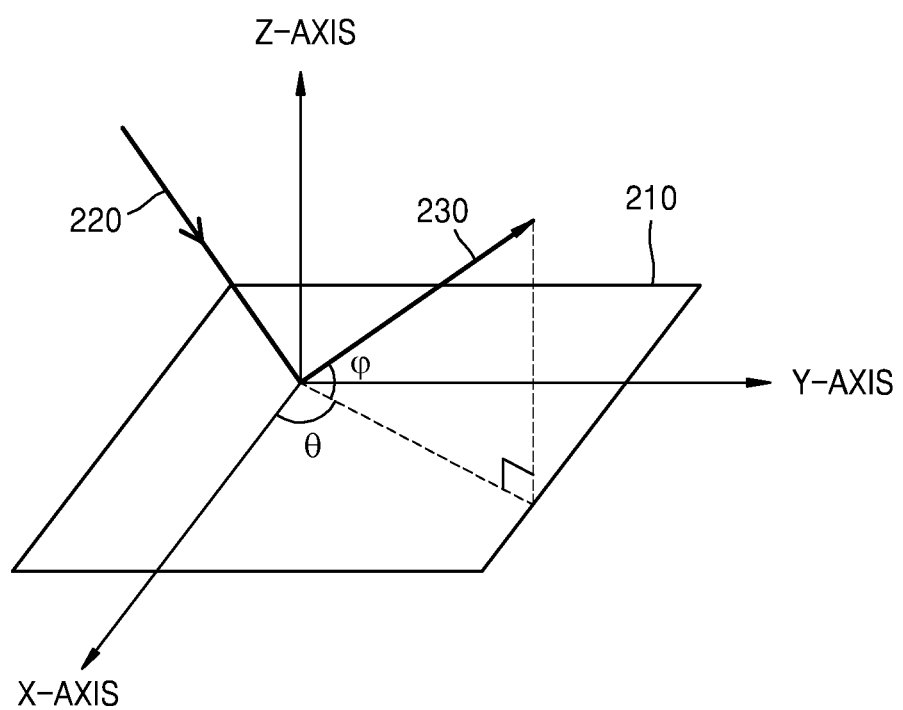
FIG. 2 is a diagram illustrating a method of 2-dimensionally steering a laser beam according to an exemplary embodiment.

FIG. 2 is a diagram illustrating a method of two-dimensionally steering a laser beam according to an exemplary embodiment.

The laser beam steering device 210 may steer a laser beam two-dimensionally. Referring to FIG. 2, the laser beam steering device 210 may steer an incident laser beam 220. At this time, not only an angle θ, but also an angle φ of a steered laser beam 230 steered by the laser beam steering device 210 may be changed. The angle θ may indicate a degree of emission of the steered laser beam 230 at a certain height in horizontal directions, whereas the angle φ may indicate a degree of emission of the steered laser beam 230 in vertical directions. For example, a method of one-dimensionally steering a laser beam is a method of changing the angle θ only. Therefore, the laser beam steering device 210 may emit a laser beam to a wider area as compared to a case of one-dimensionally steering a laser beam.

Figure 3:
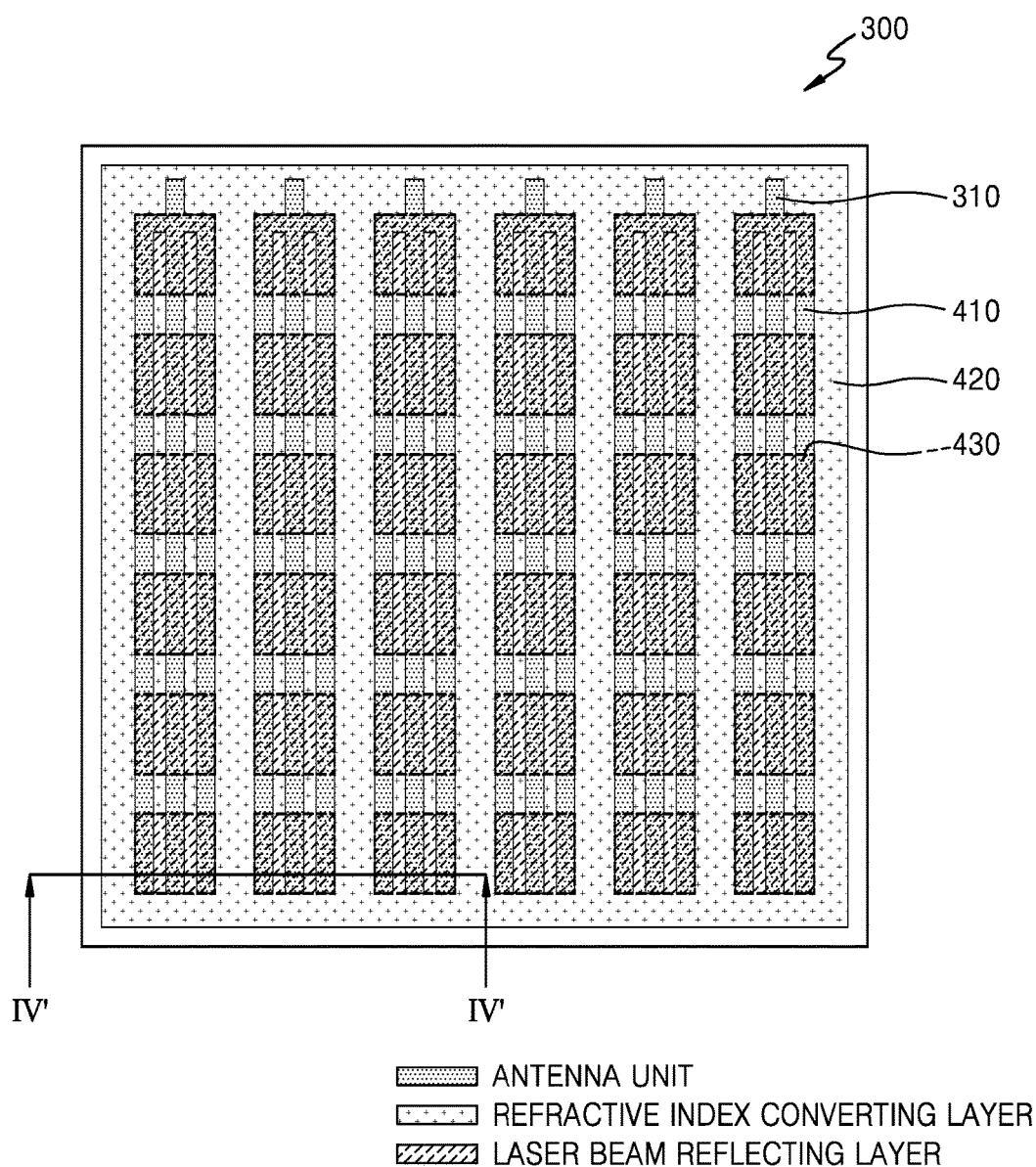
FIG. 3 is a plan view of a laser beam steering device according to an exemplary embodiment.

FIG. 3 is a plan view of a laser beam steering device according to an exemplary embodiment.

Referring to FIG. 3, a laser beam steering device 300 includes an antenna unit including an antenna 310, a refractive index converting layer 420, and a laser beam reflecting layer including a cell 430. The laser beam steering device 300 may further include a driver that is disposed below the laser beam reflecting layer and applies an electric signal to the laser beam reflecting layer.

The antenna unit may be located above the refractive index converting layer 420 and may include the plurality of antennas. Each of the antennas is arranged to extend in a first direction (a vertical direction in FIG. 3) and may receive a laser beam. Furthermore, the antenna 310 may include a sub-antenna 410 branched from the antenna 310. For example, although FIG. 3 shows that the antenna unit includes the total six antennas and each of the antennas is branched to three sub-antennas, the shape of the antenna unit is not limited thereto. Meanwhile, the antenna unit may include TiN, TaN and an alloy including at least one of Ag, Au and Al, but is not limited thereto.

The refractive index converting layer 420 is located under the antenna unit and may change the refractive index of a laser beam incident to the antenna unit. In order to change the refractive index, the refractive index converting layer 420 may include a material whose charge concentration may change based on a voltage applied thereto. For example, the refractive index converting layer 420 may include an oxide semiconductor. In detail, the refractive index converting layer 420 may include Indium-Tin-Oxide (ITO), Indium-Zinc-Oxide (IZO), Ga—In—Zn-Oxide (GIZO), Ga—Zn-Oxide (AZO), and ZnO, but is not limited thereto. Meanwhile, the refractive index converting layer 420 may be disposed to have a relatively small thickness so as not to affect the wavelength of an incident laser beam. For example, the refractive index converting layer 420 may have a thickness less than or equal to 5 nm, but the thickness of the refractive index converting layer 420 is not limited thereto.

The laser beam reflecting layer may include the plurality of cells 430 that are located below the refractive index converting layer 420 and arranged in a two-dimensional matrix. For example, the plurality of cells may be disposed in a first direction below the refractive index converting layer 420 corresponding to the one antenna 310. Meanwhile, the laser beam reflecting layer may include a metal.

The laser beam reflecting layer may change the charge concentration of the refractive index converting layer 420 according to a voltage input from the driver. For example, when a voltage is applied between the laser beam reflecting layer and the antenna unit by the driver, the charge concentration of the refractive index converting layer 420 is changed. Therefore, the laser beam steering device 120 may change the refractive index of the refractive index converting layer 420 by controlling a voltage applied to the laser beam reflecting layer through the driver.

Figure 4:
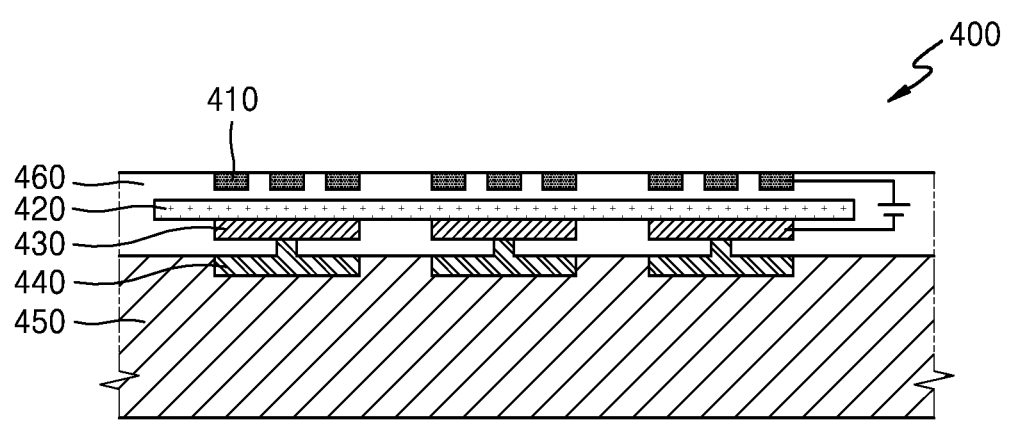
FIG. 4 is a cross-sectional view, taken along the line IV-IV' of FIG. 3 according to an exemplary embodiment.

FIG. 4 is a cross-sectional view taken along the line IV-IV' of FIG. 3, according to an exemplary embodiment.

Referring to FIG. 4, the antenna unit may be disposed above the refractive index converting layer 420, of which the refractive index is converted according to an electrical signal. The antenna unit includes a plurality of antennas, and each of the antennas may include a plurality of sub-antennas. Furthermore, the laser beam reflecting layer may be disposed below the refractive index converting layer 420 in the form of the plurality of cells, and a driving circuit 440 may be disposed below each of the cell 430 of the laser beam reflecting layer. In particular, the plurality of cells 430 may be arranged in a two-dimensional matrix. The driving circuit 440 may be included in the driver, and may be connected to each of the plurality of cells 430 of the laser beam reflecting layer, and apply an electrical signal thereto.

An insulation layer 460 may be disposed between the refractive index converting layer 420 and the sub-antenna 410. The insulation layer 460 may include various types of insulation materials. For example, the insulation layer 460 may include, but is not limited to, a silicon oxide, a silicon nitride, $Al_2O_3$, $ZrO_2$, or $HfO_2$.

The driving circuit 440 may apply a voltage between the antenna and the cells 430 of the laser beam reflecting layer. Particularly, the driving circuits 440 are connected to the plurality of cells 430 of the laser beam reflecting layer through via holes and may independently control voltages applied to the respective cells. Therefore, portions of the refractive index converting layer 420 corresponding to the respective cells 430 may exhibit different refractive indices according to the voltages applied to the respective cells 430, and thus the laser beam may be steered in a desired direction.

Furthermore, since the driving circuit 440 is located under the laser beam reflecting layer, the volume of the laser beam steering device 120 may be reduced. For example, when a first voltage is input to the antenna 310 and a voltage between a ground voltage and the first voltage is applied to the cell 430 of the laser beam reflecting layer from the driving circuit 440, the charge concentration of the refractive index converting layer 420 may be changed according to the voltage applied to the cell 430 of the laser beam reflecting layer. Here, the first voltage may be the highest voltage that may be applied as a data voltage, but is not limited thereto.

Meanwhile, the components 410 through 440 and 460 of the laser beam steering device 400 may be mounted on the substrate 450.

Figure 5:
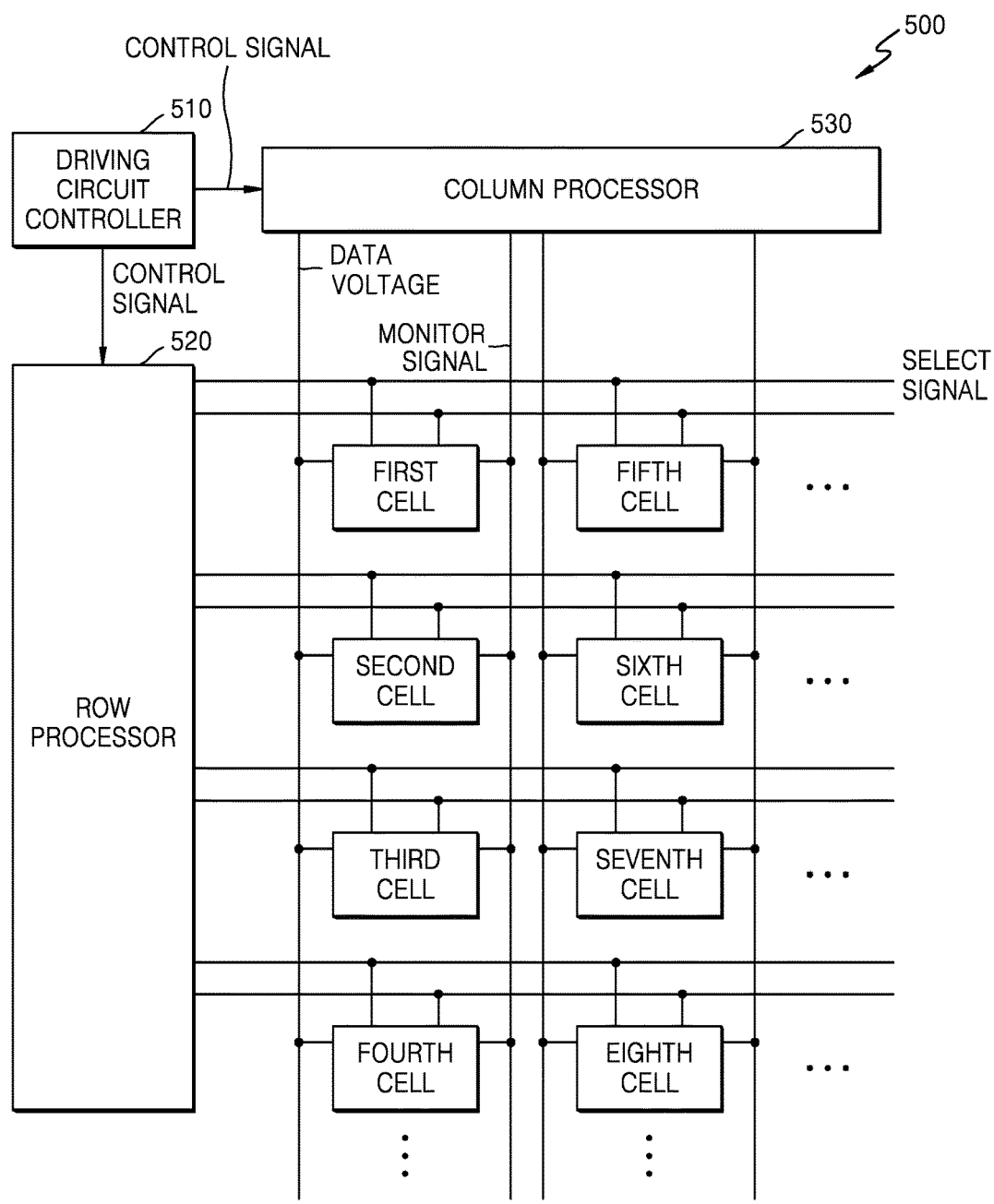
FIG. 5 is a diagram illustrating a laser beam steering device and a controller according to an exemplary embodiment.

FIG. 5 is a diagram illustrating a laser beam steering device and a controller according to an exemplary embodiment.

Referring to FIG. 5, driving circuits may be disposed in correspondence to respective cells of the laser beam reflecting layer that are arranged in a two-dimensional matrix. The first through eighth cells of FIG. 5 represent driving circuits connected to the respective cells of the laser beam reflecting layer. Hereinafter, in FIGS. 5 and 6, the driving circuits corresponding to the respective cells of the laser beam reflecting layer are shown as the cells for convenience of explanation.

A controller 500 may include a driving circuit controller 510, a row processor 520, and a column processor 530. The driving circuit controller 510, a row processor 520, and the column processor 530 may be one or more processors, such as systems on chip (SoCs), application-specific integrated circuits (ASICs), etc.

The driving circuit controller 510 may control each cell by transmitting control signals to the row processor 520 and the column processor 530. The row processor 520 may select at least one row from among a plurality of cells arranged two-dimensionally according to a control signal received from the driving circuit controller 510. The column processor 530 may apply data voltages to cells included in a selected column according to a control signal received from the driving circuit controller 510 and may apply monitor signals to the cells.

For example, the row processor 520 may select a column including a first cell and a fifth cell according to a control signal received from the driving circuit controller 510. In this case, the column processor 530 may apply data voltages to the first cell and the fifth cell and store the data voltages in the first cell and the fifth cell. Furthermore, the controller 500 may determine whether there is a leakage current in capacitors included in the first cell and the fifth cell by applying monitor signals to the first cell and the fifth cell. Meanwhile, the row processor 520 may sequentially or randomly select columns.

Meanwhile, until voltages are stored in all of the cells included in the laser beam steering device 120, each cell may retain a voltage stored therein. After voltages are stored in all of the cells, the laser beam steering device 120 may steer a laser beam incident from the laser beam source 110 in a desired direction. For example, the laser beam steering device 120 may store voltages in all of the cells for about 2 μs and then steer a laser beam for about 5 ns. However, the time of retaining stored voltage and the laser beam steering time of the laser beam steering device 120 are not limited thereto.

Figure 6:
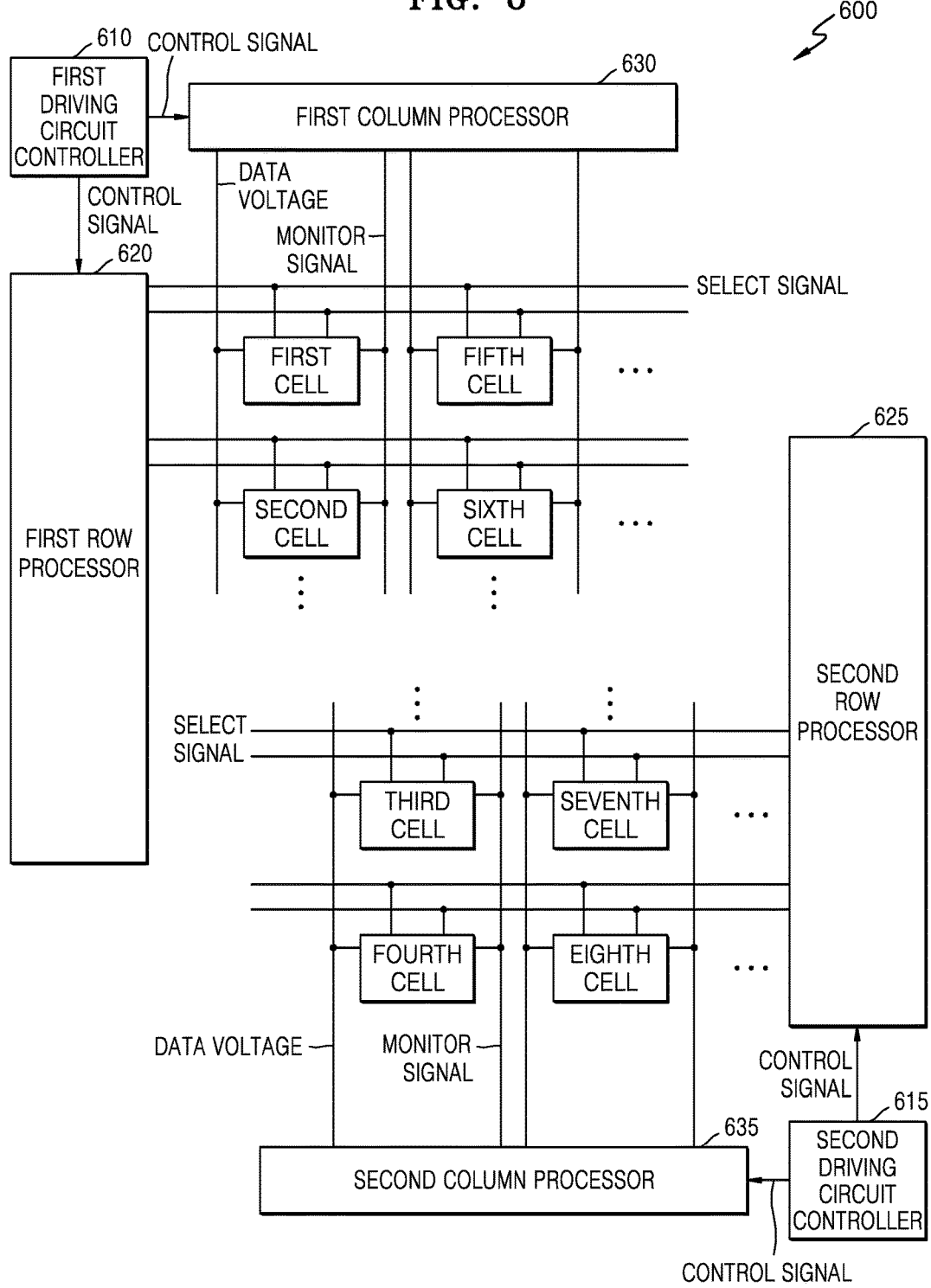
FIG. 6 is a diagram illustrating a laser beam steering device and a controller according to an exemplary embodiment.

FIG. 6 is a diagram illustrating a laser beam steering device and a controller according to an exemplary embodiment.

A controller 600 may include a plurality of driving circuit controllers 610 and 615, row processors 620 and 625, and column processors 630 and 635. Meanwhile, retention of stored voltage of each cell may increase the burden on devices included in the cell. However, since the laser beam steering device 120 stores voltages in respective cells column-by-column, when the number of columns including cells increases, the time period for the cells to retain the stored voltages may also increase.

The controller 600 may control a first cell, a second cell, a fifth cell, and a sixth cell through the first driving circuit controller 610 and may control a third cell, a fourth cell, a seventh cell, and an eighth cell through the second driving circuit controller 615. In this case, the time for storing voltages in the cells included in the laser beam steering device 120 may be reduced. In other words, since the time for each cell to retain a stored voltage may be reduced, the burden on devices included in the cell may be reduced.

For convenience of explanation, one of the plurality of driving circuits included in the laser beam steering device 120 will be described below with reference to FIGS. 7 through 13.

Figure 7:
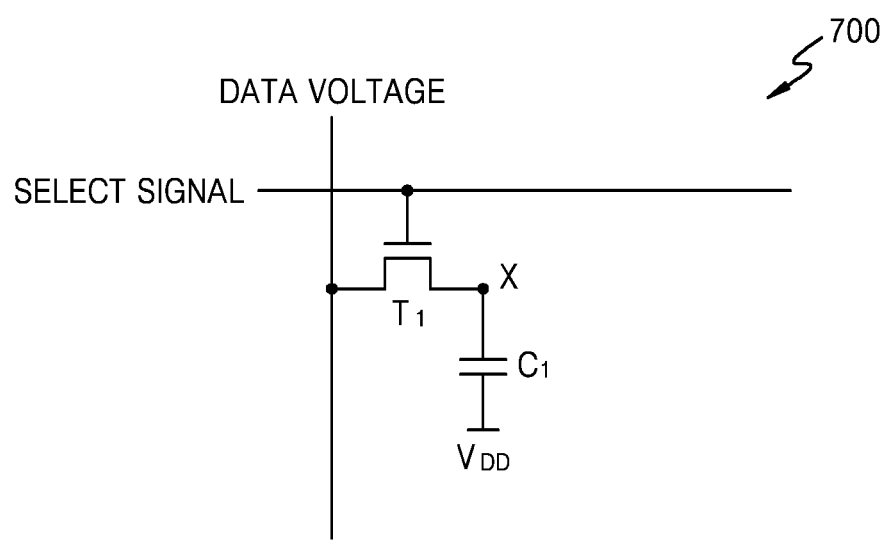
FIG. 7 is a diagram illustrating a driving circuit of a laser beam steering device according to an exemplary embodiment.

FIG. 7 is a diagram illustrating a driving circuit of a laser beam steering device according to an exemplary embodiment.

A first capacitor $C_1$ in FIGS. 7 through 13 may be one of elements for storing a voltage for steering a laser beam. A first voltage $V_{DD}$ may be applied to a first node of the first capacitor $C_1$ and a voltage between a ground voltage $V_{GND}$ and the first voltage $V_{DD}$ may be applied to a second node X of the first capacitor $C_1$. Alternatively, the ground voltage $V_{GND}$ may be applied to the first node of the first capacitor $C_1$ and a voltage between the ground voltage $V_{GND}$ and a negative first voltage $-V_{DD}$ may be applied to the second node X of the first capacitor $C_1$. In FIGS. 7 through 10, a driving circuit in which the first voltage $V_{DD}$ is applied to the first node of the first capacitor $C_1$ will be described for convenience of explanation.

Referring to FIG. 7, the driving circuit 700 may include a first transistor $T_1$ and the first capacitor $C_1$. Here, when an ON voltage is applied to a gate of the first transistor $T_1$, the first capacitor $C_1$ stores a data voltage. After that, when an OFF voltage is input to the gate of the first transistor $T_1$, the first capacitor $C_1$ may retain the data voltage stored therein.

The first transistor $T_1$ may switch a data voltage according to a select signal. Particularly, a select signal line is connected to the gate of the first transistor $T_1$ and a data voltage line is connected to a first terminal of the first transistor $T_1$. When a select signal is received, a data voltage may be received from the data voltage line.

The first capacitor $C_1$ may store a voltage input from the first transistor $T_1$. According to an aspect of an exemplary embodiment, the first voltage $V_{DD}$ may be supplied to the first node of the first capacitor $C_1$ and the second node X may be connected to a second terminal of the first transistor $T_1$. In this case, when a select signal is applied, the first capacitor $C_1$ may store a voltage equivalent to a difference between a data voltage and the first voltage $V_{DD}$. Here, the first voltage $V_{DD}$ may indicate the highest voltage of a data voltage. For example, when a data voltage to be applied to the laser beam reflecting layer through the driving circuit 700 is the ground voltage $V_{GND}$, the first voltage $V_{DD}$ may be stored in the first capacitor $C_1$. In other words, when the first voltage $V_{DD}$ is applied to the antenna 310 and a voltage between the ground voltage $V_{GND}$ and the first voltage $V_{DD}$ is applied to the laser beam reflecting layer connected to the driving circuit 700, the charge concentration of a region of the refractive index converting layer 420 close to the antennas 310 may be changed. Therefore, coupling between the laser beam steering device 120 and the laser beam 220 may be maximized.

Figure 8:
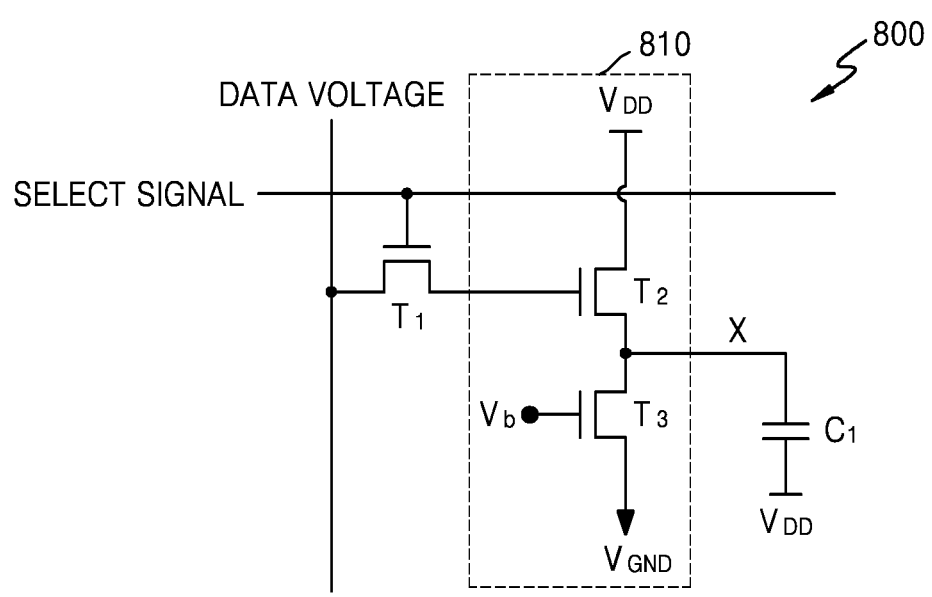
FIG. 8 is a diagram illustrating a driving circuit of a laser beam steering device, the driving circuit compensating for a leakage current, according to an exemplary embodiment.

FIG. 8 is a diagram illustrating a driving circuit of a laser beam steering device for compensating for a leakage current, according to an exemplary embodiment.

Referring to FIG. 8, compared to the driving circuit 700 of FIG. 7, a driving circuit 800 may compensate for a current leaked from the first capacitor $C_1$ with an added circuit 810. In particular, the added circuit 810 may include a second transistor $T_2$ and a third transistor $T_3$. When a current is leaked from the first capacitor $C_1$ of the driving circuit 800, the second transistor $T_2$ and the third transistor $T_3$ may compensate for the current leaked from the first capacitor $C_1$, and thus the first capacitor $C_1$ may retain a voltage stored therein for a longer time.

The second terminal of the first transistor $T_1$ may be connected to a gate of the second transistor $T_2$ and the first voltage $V_{DD}$ may be connected to a first terminal of the second transistor $T_2$. The second node X of the first capacitor $C_1$ may be connected to a second terminal of the second transistor $T_2$. Therefore, when a data voltage is applied by the first transistor $T_1$, the second transistor $T_2$ may transmit the data voltage to the first capacitor $C_1$. For example, when an ON voltage is applied to the gate of the first transistor $T_1$, a data voltage is transmitted to the gate of the second transistor $T_2$, and a certain voltage may be applied to the first capacitor $C_1$ via the second transistor $T_2$, which is connected to the first voltage $V_{DD}$.

A bias voltage $V_b$ may be input to a gate of the third transistor $T_3$ and the second node X of the first capacitor $C_1$ may be connected to a first terminal of the third transistor $T_3$. Furthermore, the ground voltage $V_{GND}$ may be connected to a second terminal of the third transistor $T_3$. For example, when a current is leaked from the first capacitor $C_1$, the voltage of the second node X of the first capacitor $C_1$ increases. In this case, since a voltage difference between the gate of the second transistor $T_2$ and the second terminal of the second transistor $T_2$ decreases, the operation of the second transistor $T_2$ is interrupted. Furthermore, due to the increased voltage of the second node X of the first capacitor $C_1$, an excessive current flows from the first terminal of the third transistor $T_3$ to the second terminal of the third transistor $T_3$. Therefore, the voltage of the second node X of the first capacitor $C_1$ decreases. Meanwhile, since the bias voltage $V_b$ is applied to the gate of the third transistor $T_3$, the third transistor $T_3$ may become a current source. Furthermore, the third transistor $T_3$ operating as a current source may be replaced with a diode connected transistor or a resistor, but is not limited thereto.

Meanwhile, the first capacitor $C_1$ may be a metal oxide semiconductor (MOS) capacitor, but is not limited thereto.

Figure 9:
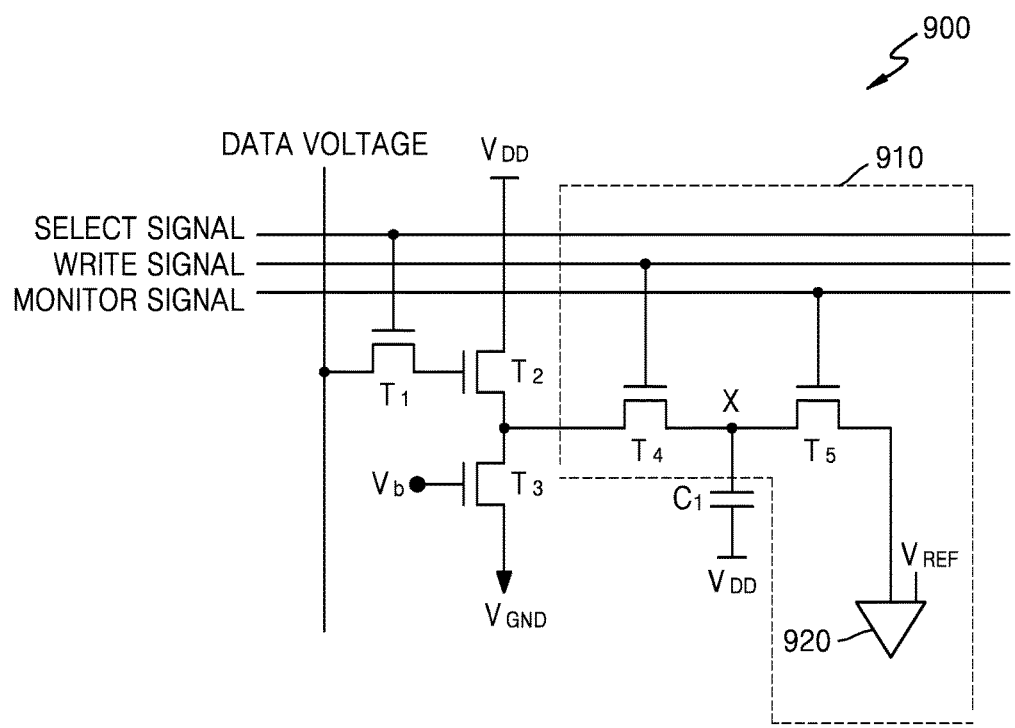
FIG. 9 is a diagram illustrating a driving circuit of a laser beam steering device, the driving circuit monitoring a voltage stored in a first capacitor, according to an exemplary embodiment.

FIG. 9 is a diagram illustrating a driving circuit of a laser beam steering device for monitoring a voltage stored in a first capacitor according to an exemplary embodiment.

Compared to the driving circuit 800 of FIG. 8, a driving circuit 900 of FIG. 9 may monitor a voltage stored in the first capacitor $C_1$ with an added circuit 910. Referring to FIG. 9, the added circuit 910 that is added to a driving circuit equivalent to the driving circuit 800 of FIG. 8 may include a fourth transistor $T_4$, a fifth transistor $T_5$, and an amplifier 920.

A gate of the fourth transistor $T_4$ may be connected to a write signal line, and a first terminal of the fourth transistor $T_4$ may be connected to the second terminal of the second transistor $T_2$. Furthermore, the second terminal of the fourth transistor $T_4$ may be connected to the second node X of the first capacitor $C_1$. As a write signal is applied to the fourth transistor $T_4$, a data voltage applied to the second transistor $T_2$ may be stored in the first capacitor $C_1$. Meanwhile, when a write signal is applied to the gate of the fourth transistor $T_4$, the fifth transistor $T_5$ may be in the OFF state, in which the operation of the fifth transistor $T_5$ is stopped.

A gate of the fifth transistor $T_5$ may be connected to a monitor signal line, and a first terminal of the fifth transistor $T_5$ may be connected to the second node X of the first capacitor $C_1$. Furthermore, a second terminal of the fifth transistor $T_5$ may be connected to the amplifier 920. The fifth transistor $T_5$ may receive a monitor signal and may transmit the voltage of the second node X of the first capacitor $C_1$ to the amplifier 920. Meanwhile, when a monitor signal is input to the fifth transistor $T_5$, the fourth transistor $T_4$ may be in the OFF state, in which the operation of the fourth transistor $T_4$ is stopped.

The amplifier 920 may be connected to the second terminal of the fifth transistor $T_5$ and may output a voltage based on a difference between a voltage stored in the first capacitor $C_1$ and a reference voltage $V_{REF}$. For example, the driving circuit 900 may monitor an abnormal operation of the first capacitor $C_1$ based on a voltage output from the amplifier 920. Meanwhile, the controller 130 may apply a monitor signal to the driving circuit 900 periodically or based on a user input.

Figure 10:
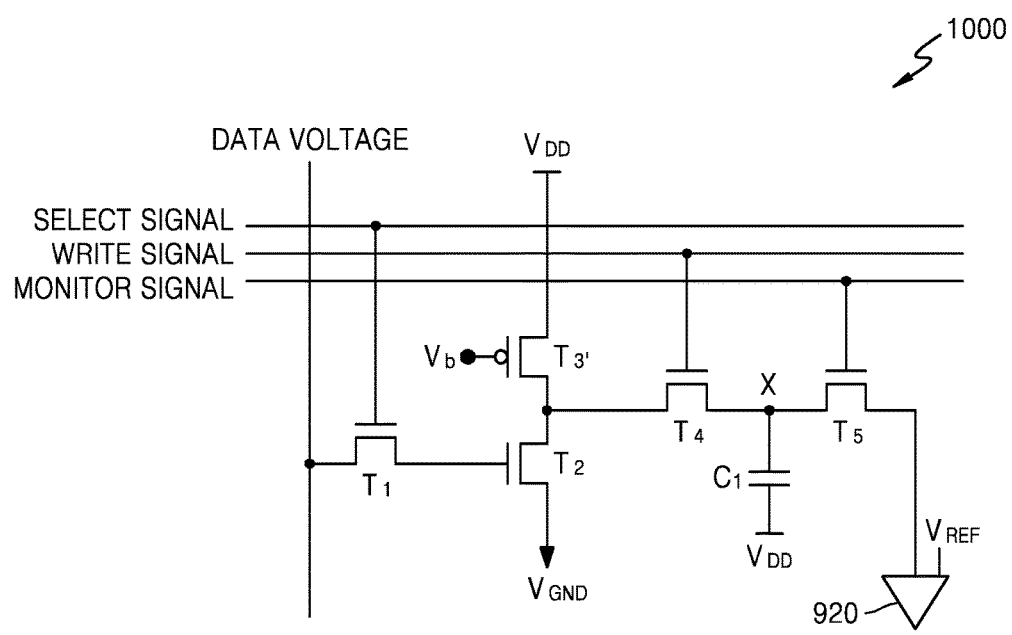
FIG. 10 is a diagram illustrating a driving circuit of a laser beam steering device according to another exemplary embodiment.

FIG. 10 is a diagram illustrating a driving circuit of a laser beam steering device according to an exemplary embodiment.

A driving circuit 1000 may compensate for a leaked current when a current is leaked from the first capacitor $C_1$ and monitor a voltage stored in the first capacitor $C_1$. Here, a third P transistor $T_3'$ of the driving circuit 1000 may be a P-channel MOS transistor, and a first terminal of the third P transistor $T_3'$ may be connected to the first voltage $V_{DD}$. The first terminal of the fourth transistor $T_4$ may be connected to a second terminal of the third P transistor $T_3'$. Meanwhile, the first terminal of the second transistor $T_2$ may be connected to the second terminal of the third P transistor $T_3'$, and the second terminal of the second transistor $T_2$ may be connected to the ground voltage $V_{GND}$. Since the amplifier 920 of FIG. 10 corresponds to the amplifier 920 of FIG. 9, detailed description of the amplifier 920 will be omitted.

Referring to FIG. 10, the second transistor $T_2$ may apply a voltage to the second node X of the first capacitor $C_1$ based on a data voltage input from the first transistor $T_1$. For example, when a current leaks from the first capacitor $C_1$, the voltage of the second node X of the first capacitor $C_1$ increases. In this case, a current flows from the first terminal of the second transistor $T_2$ to the second terminal of the second transistor $T_2$. Therefore, the voltage of the second node X of the first capacitor $C_1$ may be retained constantly.

Figure 11:
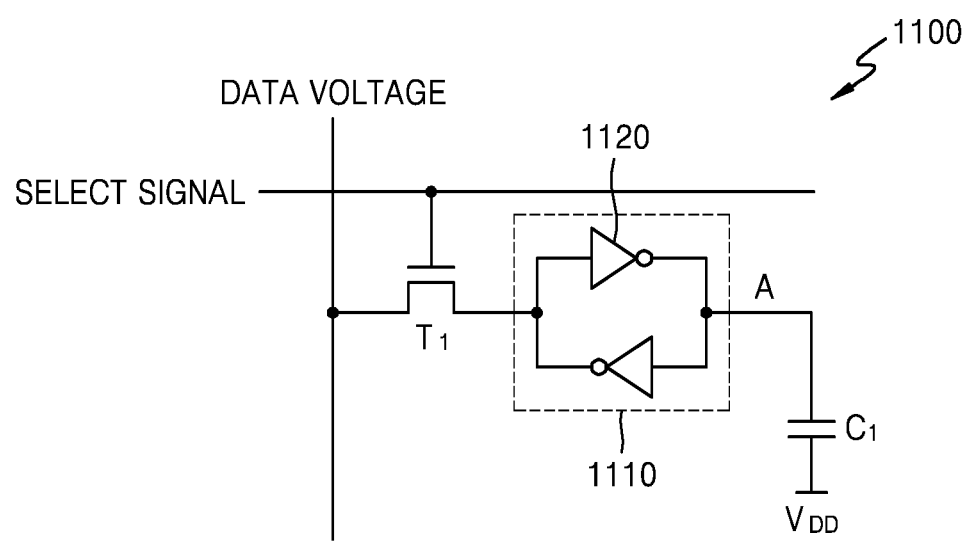
FIG. 11 is a diagram illustrating a driving circuit of a laser beam steering device, the driving circuit retaining an input data voltage, according to an exemplary embodiment.

FIG. 11 is a diagram illustrating a driving circuit of a laser beam steering device that retains an input data voltage according to an exemplary embodiment.

A driving circuit 1100 may retain a voltage stored in the first capacitor $C_1$. Referring to FIG. 11, the driving circuit 1100 may further include a latch 1110 as compared to the driving circuit 700 of FIG. 7.

When a clock signal is input, the latch 1110 receives a data voltage at that time and may constantly output the data voltage until a next clock signal is input. The latch 1110 may include two inverters 1120 connected to each other in a closed circuit, but the configuration of the latch 1110 is not limited thereto. For example, the driving circuit 1100 may store a voltage in the first capacitor $C_1$ and retain the voltage until voltages are stored in driving circuits included in the other cells. Furthermore, the driving circuit 1100 may input a constant data voltage corresponding to that of the time at which the clock signal is input to the first capacitor $C_1$ instead of inputting a continuously changing data voltage to the first capacitor $C_1$.

Here, the first node of the first capacitor $C_1$ may be connected to the first voltage $V_{DD}$ and the second node A of the first capacitor $C_1$ may be connected to an output terminal A of the latch 1110. Alternatively, the first node of the first capacitor $C_1$ may be connected to the ground voltage $V_{GND}$ and the second node A may receive the negative first voltage $-V_{DD}$. Therefore, the charge concentration of the refractive index converting layer 420 may change based on a voltage input to the second node A of the first capacitor $C_1$ of each of the driving circuits 1100 of the laser beam reflecting layer.

Meanwhile, as shown in in FIGS. 11 through 13, a driving circuit in which the first voltage $V_{DD}$ is applied to the first node of the first capacitor $C_1$ will be described for convenience of explanation.

Figure 12:
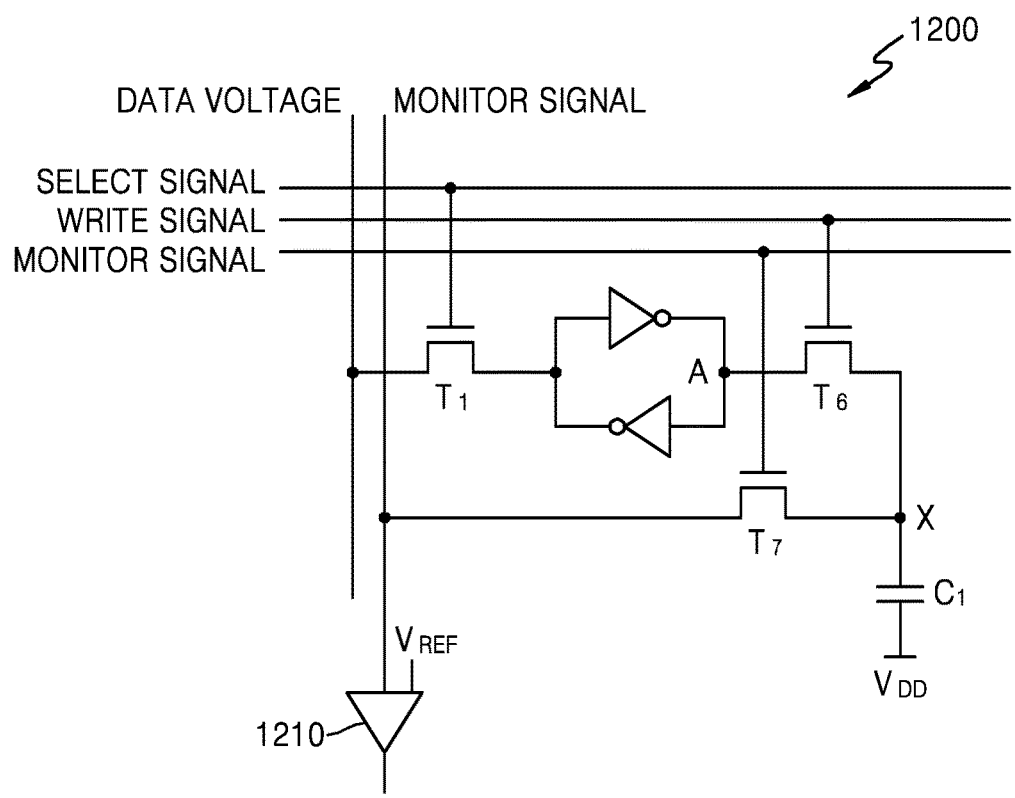
FIG. 12 is a diagram illustrating a driving circuit of a laser beam steering device, the driving circuit retaining an input data voltage, according to another embodiment.

FIG. 12 is a diagram illustrating a driving circuit of a laser beam steering device for retaining an input data voltage according to an exemplary embodiment.

Compared to the driving circuit 1100 of FIG. 11, a driving circuit 1200 of FIG. 12 may include a sixth transistor $T_6$.

A gate of the sixth transistor $T_6$ may be connected to a write signal line, and a first terminal of the sixth transistor $T_6$ may be connected to an output terminal A of the latch 1110. Furthermore, a second terminal of the sixth transistor $T_6$ may be connected to the second node X of the first capacitor $C_1$. Therefore, the laser beam steering device 120 applies a data voltage to the output terminal A of the latch 1110 via the first transistor $T_1$ by applying a select signal to the gate of the first transistor $T_1$, and then simultaneously apply a data voltage to the second node X of the first capacitor $C_1$ via the sixth transistor $T_6$ included in each of the cells of the laser beam steering device 120 by applying a write signal to the gate of the sixth transistor $T_6$.

The driving circuit 1200 according to an exemplary embodiment may further include a seventh transistor $T_7$ and an amplifier 1210.

A gate of the seventh transistor $T_7$ may be connected to a monitor signal line, and a first terminal of the seventh transistor $T_7$ may be connected to the amplifier 1210. Furthermore, a second terminal of the seventh transistor $T_7$ may be connected to the second node X of the first capacitor $C_1$.

The amplifier 1210 is connected to the first terminal of the seventh transistor $T_7$ and may output a voltage based on a difference between a voltage stored in the first capacitor $C_1$ and the reference voltage $V_{REF}$. For example, the driving circuit 1200 may monitor an abnormal operation of the first capacitor $C_1$ based on a voltage output from the amplifier 1210. Meanwhile, the controller 130 may apply a monitor signal to the driving circuit 1200 periodically or based on a user input.

Figure 13:
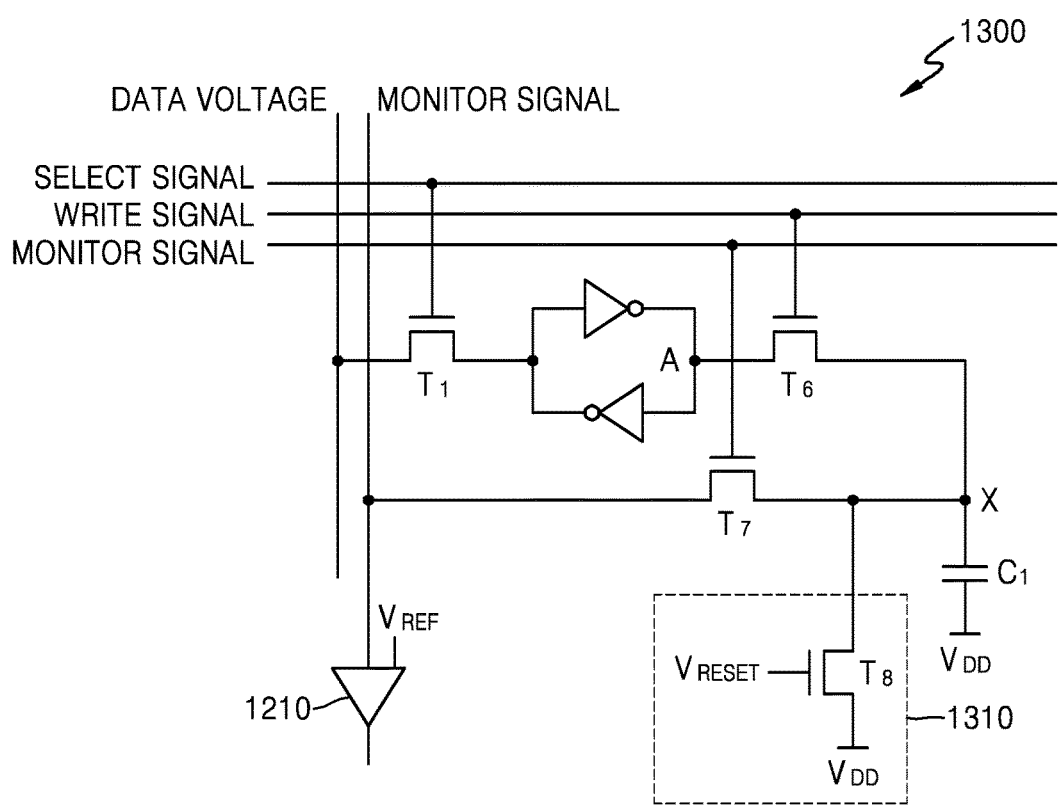
FIG. 13 is a diagram illustrating a driving circuit of a laser beam steering device, the driving circuit retaining an input data voltage, according to another embodiment.

FIG. 13 is a diagram illustrating a driving circuit of a laser beam steering device that retains an input data voltage according to an exemplary embodiment.

A driving circuit 1300 may further include an eighth transistor $T_8$ as compared to the driving circuit 1200 of FIG. 12.

A first terminal of the eighth transistor $T_8$ may be connected to the second node X of the first capacitor $C_1$, and a second terminal of the eighth transistor $T_8$ may be connected to the first voltage $V_{DD}$. Therefore, the eighth transistor $T_8$ may reset a data voltage of the first capacitor $C_1$ based on a voltage $V_{RESET}$ input to a gate of the eighth transistor $T_8$.

For example, the laser beam steering device 120 may stop an operation of the sixth transistor $T_6$ by stopping the input of a write signal after steering the laser beam. The laser beam steering device 120 may also apply a voltage $V_{RESET}$ to the gate of the eighth transistor $T_8$ so as to apply the first voltage $V_{DD}$ to the second node X of the first capacitor $C_1$ included in each of the cells of the laser beam steering device 120. At the same time, the laser beam steering device 120 may apply a select signal in order to apply a data voltage to the output terminal A of the latch 1110 through the first transistor $T_1$. In this case, the time elapsed for applying the data voltages to the second node X of the first capacitor $C_1$ may be the time period (about 5 ns) elapsed for incidence of a laser beam. Therefore, the burden on the first capacitor $C_1$ may be reduced and the lifespan of the first capacitor $C_1$ may be extended.

Figure 14:
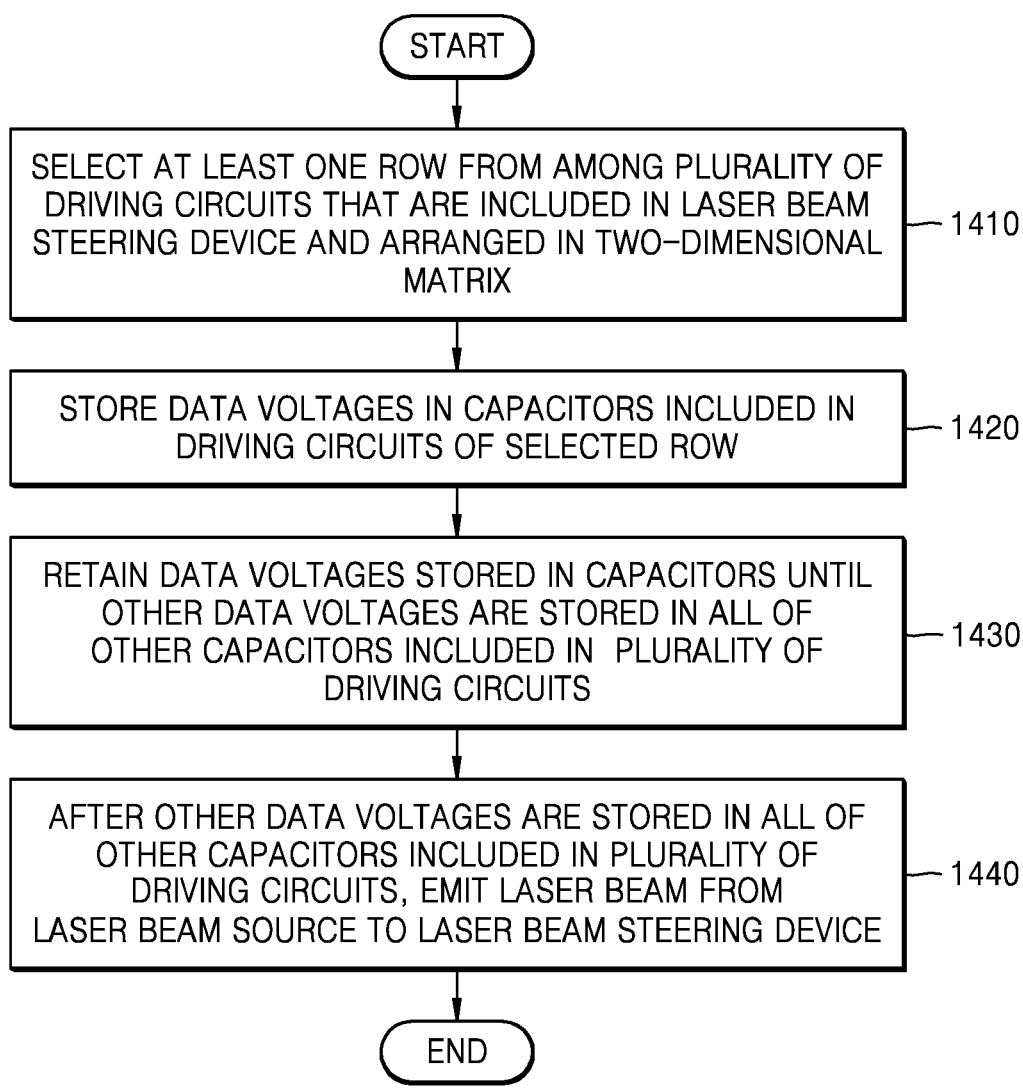
FIG. 14 is a flowchart of a method of 2-dimensionally steering a laser beam, according to an exemplary embodiment.

FIG. 14 is a flowchart of a method of two-dimensionally steering a laser beam, according to an exemplary embodiment.

In operation 1410, the controller 130 may select at least one row from among the plurality of driving circuits 440 that are included in the laser beam steering device 120 and arranged in a two-dimensional matrix. At this time, the plurality of driving circuits 440 may be respectively connected to the plurality of cells of the laser beam reflecting layer included in the laser beam steering device 120 through via holes and independently control voltages input to the respective cells.

In operation 1420, the controller 130 may store data voltages in capacitors included in the driving circuits 440 of the selected row. For example, the driving circuit 440 may include the first transistor $T_1$ and the first capacitor $C_1$. When the first transistor $T_1$ of the driving circuit 440 receives a select signal from the row processor 520 of the controller 130, the first transistor $T_1$ may input a data voltage to the first capacitor $C_1$. At this time, the first capacitor $C_1$ may store a difference between the first voltage $V_{DD}$ and the data voltage.

According to an aspect of an exemplary embodiment, the driving circuit 440 may further include a voltage storage element that is connected to the capacitor $C_1$ and applies a data voltage to the capacitor. For example, when the driving circuit 440 includes the latch 1110, the latch 1110 may be connected between the first transistor $T_1$ and the first capacitor $C_1$ and store a data voltage input from the first transistor $T_1$. Furthermore, the latch 1110 may apply the stored voltage to the first capacitor $C_1$. Here, the latch 1110 may be a voltage storage element.

Furthermore, the controller 130 may retain a data voltage stored in a voltage storage element until other data voltages are stored in all of the other voltage storage devices included in the plurality of driving circuits. After the other data voltages are stored in all of the other voltage storage devices, as a write signal is applied, the controller 130 may simultaneously apply the stored data voltages to the plurality of capacitors.

In operation 1430, the controller 130 may retain an input data voltage stored in a capacitor until other data voltages are stored in all of the other capacitors included in the plurality of driving circuits 440. When the driving circuit 440 includes the second transistor $T_2$ and the third transistor $T_3$ and a current is leaked from the first capacitor $C_1$ of the driving circuit 440, the driving circuit 440 may compensate for the leakage current, thereby retaining a voltage stored in the first capacitor $C_1$. Furthermore, when the driving circuit 440 includes the fourth transistor $T_4$, the fifth transistor $T_5$, and the amplifier 920, the driving circuit 440 may monitor whether a current is leaked from the first capacitor $C_1$.

In operation 1440, after data voltages are stored in the plurality of capacitors included in the plurality of driving circuits 440, the controller 130 may emit a laser beam from the laser beam source 110 to the laser beam steering device 120.

According to an aspect of an exemplary embodiment, a laser beam steering device may two-dimensionally steer a laser beam. Furthermore, a driving circuit included in the laser beam steering device may detect a leakage current in a circuit and compensate for the leakage current. Furthermore, the volume of the laser beam steering device may be reduced, because the driving circuit is located below a laser beam reflecting layer.

It should be understood that exemplary embodiments described herein should be considered in a descriptive sense only and not for purposes of limitation. Descriptions of features or aspects within each embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A laser beam steering device for two-dimensionally steering a laser beam, the laser beam steering device comprising:
   a refractive index converting layer whose charge concentration is configured to change based on an electric signal applied thereto;
   an antenna disposed above the refractive index converting layer;
   a laser beam reflecting layer disposed below the refractive index converting layer and comprising a plurality of cells arranged in a two-dimensional matrix; and
   a driver disposed below the laser beam reflecting layer and comprising a plurality of driving circuits respectively connected to the plurality of cells, the plurality of driving circuits being configured to respectively apply electric signals to the plurality of cells.

2. The laser beam steering device of claim 1, wherein the laser beam reflecting layer comprises a metal, and
   wherein the plurality of driving circuits are respectively connected to the plurality of cells through via holes and configured to independently control voltages respectively applied to the plurality of cells.

3. The laser beam steering device of claim 2, wherein, in response to one of (i) a first voltage being applied to the antenna and a second voltage between a ground voltage and the first voltage being applied to the plurality of cells from the plurality of driving circuits, and (ii) the ground voltage being applied to the antenna and a third voltage between the ground voltage and a negative amount of the first voltage being applied to the plurality of cells from the plurality of driving circuits, the charge concentration of the refractive index converting layer is changed based on one of the second voltage and the third voltage being applied to respective cells of the laser beam reflecting layer.

4. The laser beam steering device of claim 1, wherein each of the plurality of driving circuits comprises:
   a first transistor, which is connected to a select signal line via a gate of the first transistor, the first transistor being connected to a data voltage line via a first terminal of the first transistor, and the first transistor being configured to switch a data voltage according to a select signal; and a first capacitor, which is connected to a first voltage via a first node of the first capacitor, and configured to store the data voltage input through a second node of the first capacitor.

5. The laser beam steering device of claim 4, wherein a second terminal of the first transistor is connected to the second node of the first capacitor, and wherein a voltage stored in the first capacitor corresponds to a difference between the data voltage and the first voltage.

6. The laser beam steering device of claim 4, wherein the each of the plurality of driving circuits further comprises:

a second transistor, which is connected to a second terminal of the first transistor via a gate of the second transistor, the second transistor being connected to another first voltage via a first terminal of the second transistor, and the second transistor being further connected to the second node of the first capacitor via a second terminal of the second transistor; and a third transistor, which is connected to the second node of the first capacitor via a first terminal of the third transistor, the third transistor being connected to a ground voltage via a second terminal of the third transistor, and the third transistor being configured to compensate for a current leaked from the first capacitor.

7. The laser beam steering device of claim 6, wherein the each of the plurality of driving circuits further comprises:

a fourth transistor, which is connected to a write signal line via a gate of the fourth transistor, the fourth transistor being connected to the second terminal of the second transistor via a first terminal of the fourth transistor, the fourth transistor being further connected to the second node of the first capacitor via a second terminal of the fourth transistor;

a fifth transistor, which is connected to a monitor signal line via a gate of the fifth transistor and is connected to the second node of the first capacitor via a first terminal of the fifth transistor; and an amplifier, which is connected to a second terminal of the fifth transistor and is configured to output a second voltage based on a difference between a third voltage stored in the first capacitor and a reference voltage.

8. The laser beam steering device of claim 4, wherein the each of the plurality of driving circuits further comprises a latch disposed between a second terminal of the first transistor and the second node of the first capacitor.

9. The laser beam steering device of claim 8, wherein the each of the plurality of driving circuits further comprises a sixth transistor, which is connected to a write signal line via a gate of the sixth transistor, the sixth transistor being connected to the latch via a first terminal of the sixth transistor, the sixth transistor being further connected to the second node of the first capacitor via a second terminal of the sixth transistor, and the sixth transistor being configured to apply the data voltage to the first capacitor according to a write signal.

10. The laser beam steering device of claim 9, wherein the each of the plurality of driving circuits further comprises an eighth transistor, which is connected to the second node of the first capacitor via a first terminal of the eighth transistor, the eighth transistor being further connected to the first voltage via a second terminal of the eighth transistor, and the eighth transistor being configured to reset a voltage stored in the first capacitor based on a reset voltage applied to a gate of the eighth transistor.

11. The laser beam steering device of claim 8, wherein the each of the plurality of driving circuits further comprises:

a seventh transistor, which is connected to a monitor signal line via a gate of the seventh transistor and is connected to the second node of the first capacitor via a second terminal of the seventh transistor; and an amplifier, which is connected to a first terminal of the seventh transistor and configured to output a second voltage based on a difference between a third voltage stored in the first capacitor and a reference voltage.

12. The laser beam steering device of claim 1, further comprising an insulation layer disposed between the refractive index converting layer and the antenna, wherein the insulation layer comprises an oxide semiconductor.

13. A system comprising:

a laser beam source configured to emit a laser beam;

a laser beam steering device configured to steer the laser beam incident thereon emitted from the laser beam source; and a light receiver configured to receive the laser beam, wherein the laser beam steering device comprises:

a refractive index converting layer whose charge concentration is configured to change based on an electric signal applied thereto;

an antenna disposed above the refractive index converting layer;

a laser beam reflecting layer disposed below the refractive index converting layer and comprising a plurality of cells arranged in a two-dimensional matrix; and a driver disposed below the laser beam reflecting layer and comprising a plurality of driving circuits respectively connected to the plurality of cells, the plurality of driving circuits being configured to respectively apply electric signals to the plurality of cells.

14. The system of claim 13, wherein the laser beam reflecting layer comprises a metal, and wherein the plurality of driving circuits are respectively connected to the plurality of cells through via holes and configured to independently control voltages respectively applied to the plurality of cells.

15. The system of claim 13, wherein, in response to one of (i) a first voltage being applied to the antenna and a second voltage between a ground voltage and the first voltage being applied to the plurality of cells from the plurality of driving circuits, and (ii) the ground voltage being applied to the antenna and a third voltage between the ground voltage and a negative amount of the first voltage being applied to the plurality of cells from the plurality of driving circuits, the charge concentration of the refractive index converting layer is changed based on one of the second voltage and the third voltage being applied to respective cells of the laser beam reflecting layer.

16. The system of claim 13, wherein each of the plurality of driving circuits comprises:

a first transistor, which is connected to a select signal line via a gate of the first transistor, the first transistor being connected to a data voltage line via a first terminal of the first transistor, and the first transistor being configured to switch a data voltage according to a select signal; and a first capacitor, which is connected to a first voltage via a first node of the first capacitor, and configured to store the data voltage input through a second node of the first capacitor.

17. The system of claim 16, wherein a second terminal of the first transistor is connected to the second node of the first capacitor, and
wherein a voltage stored in the first capacitor corresponds to a difference between the data voltage and the first voltage.

18. The system of claim 16, wherein the each of the plurality of driving circuits further comprises:
a second transistor, which is connected to a second terminal of the first transistor via a gate of the second transistor, the second transistor being connected to the first voltage via a first terminal of the second transistor, and the second transistor being further connected to the second node of the first capacitor via a second terminal; and
a third transistor, which is connected to the second node of the first capacitor via a first terminal of the third transistor, the third transistor being connected to a ground voltage via a second terminal of the third transistor, and the third transistor being configured to compensate for a current leaked from the first capacitor.

19. A method of two-dimensionally steering a laser beam, the method comprising:
selecting at least one row of driving circuits from among a plurality of driving circuits that are included in a laser beam steering device and arranged in a two-dimensional matrix;
storing data voltages in capacitors included in the at least one row of driving circuits;
retaining the data voltages stored in the capacitors in the at least one row of driving circuits until other data voltages are stored in remaining capacitors included in the plurality of driving circuits; and
after the other data voltages are stored in the remaining capacitors included in the plurality of driving circuits, emitting the laser beam from a laser beam source to the laser beam steering device.

20. The method of claim 19, wherein each of the plurality of driving circuits comprises a voltage storage element connected to a capacitor and is configured to apply a data voltage to the capacitor, and
wherein the storing the data voltages in the capacitors further comprises:
storing the data voltages in voltage storage elements included in the at least one row of driving circuits;
retaining the data voltages stored in the voltage storage elements until the other data voltages are stored in remaining voltage storage elements included in the plurality of driving circuits; and
after the other data voltages are stored in the remaining voltage storage elements and a write signal is applied, simultaneously applying the stored data voltages to the capacitors.

* * * * *